United States Patent
Park et al.

(10) Patent No.: US 6,557,137 B1
(45) Date of Patent: Apr. 29, 2003

(54) BIT-ERROR RESISTANT ARITHMETIC CODING/DECODING APPARATUS AND METHOD THEREOF

(75) Inventors: Sung-hee Park, Seongnam (KR); Yeon-bae Kim, Suwon (KR); Yang-seock Seo, Seoul (KR)

(73) Assignee: Samsung Electronics Co., Ltd. (KR)

(*) Notice: Subject to any disclaimer, the term of this patent is extended or adjusted under 35 U.S.C. 154(b) by 0 days.

(21) Appl. No.: 09/573,156

(22) Filed: May 19, 2000

(30) Foreign Application Priority Data

Nov. 4, 1999 (KR) .............................. 99-48589

(51) Int. Cl.⁷ ................................ H03M 13/00
(52) U.S. Cl. ......................... 714/752; 714/755
(58) Field of Search ........................... 382/166, 234, 382/247; 341/107, 50; 714/752, 755

(56) References Cited

U.S. PATENT DOCUMENTS 5,588,069 A * 12/1996 Katayama et al. .......... 382/166
5,761,342 A * 6/1998 Yoshida ..................... 382/234
5,933,105 A * 8/1999 Cho ........................... 341/107
6,144,320 A * 11/2000 Van Der Vleuten .......... 341/50
6,240,214 B1 * 5/2001 Cho ........................... 382/247

OTHER PUBLICATIONS

Ian H. Witten, et al., "Arithmetic Coding for Data Compression," Communication of the ACM, vol. 30, No. 6, published Jun. 1987, pp. 520–540.

* cited by examiner

Primary Examiner—David Ton
(74) Attorney, Agent, or Firm—Burns, Doane, Swecker & Mathis, LLP

(57) ABSTRACT

Regarding compression/restoration of data using arithmetic coding, a bit-error resistant arithmetic coding/decoding apparatus in which a plurality of independent segments, instead of single segment of all-connected codes, are formed to reduce propagation of bit errors between symbols is provided. The apparatus gives advantages of resistance to bit error while maintaining compression efficiency similar to that of existing arithmetic encoding which only considers compression.

11 Claims, 12 Drawing Sheets

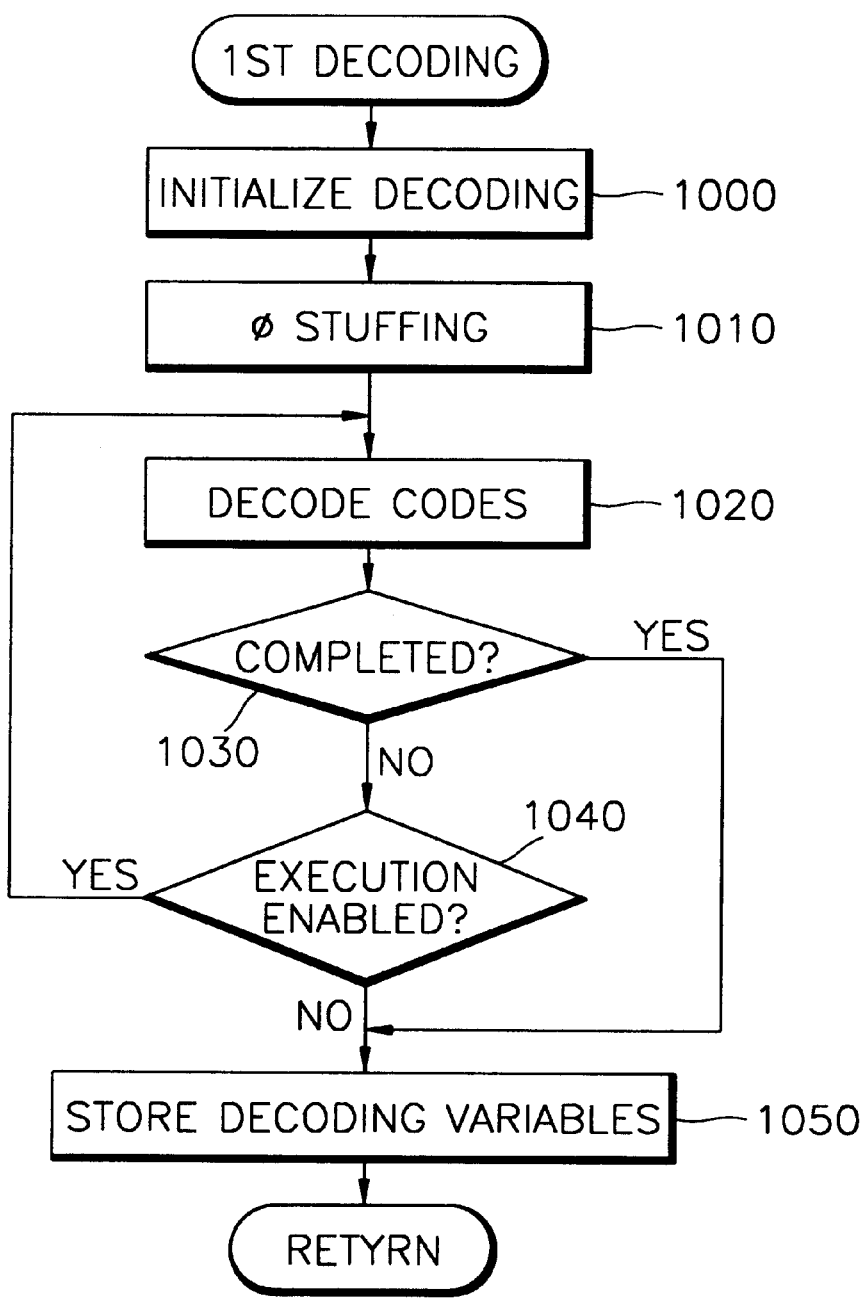

BIT-ERROR RESISTANT ARITHMETIC CODING/DECODING APPARATUS AND METHOD THEREOF

BACKGROUND OF THE INVENTION

1. Field of the Invention

The present invention relates to compression/restoration of data using arithmetic coding, and more particularly, to a bit-error resistant arithmetic coding/decoding apparatus and method therefor.

2. Description of the Related Art

Arithmetic coding is a type of data compression/restoration technique. By using arithmetic coding, a compression efficiency close to the theoretical entropy can be obtained practically. The arithmetic coding technique is described in 'Arithmetic Coding for Data Compression' on pages 520–540 of "Communication of the ACM" volume 30, Number 6, published June, 1987.

By using the arithmetic coding technique, digital data is compressed into a plurality of code words. Therefore, original data can be expressed using a lesser amount of data. However, if a bit error occurs in a code word, the code word is decoded into wrong data. In addition, because all code words generated by using the arithmetic coding technique are linked to each other, bit errors occurring in a code word are propagated to the following code words.

In general, erroneous restoration of digital data could cause a serious problem. When a voice or audio signal is transmitted and errors occur in transmission, a very harsh sound can be inserted, or a digital image signal can be restored into a seriously distorted image. In order to cope with the possible occurrence of such bit errors in data transmission, a channel that transmits compressed data needs to perform additional processes, including additional encoding for detecting the occurrence of bit errors, and error correction coding for correcting bit errors, or retransmission of data having bit errors.

If data to be transmitted is formed into a plurality of independent segments in order to solve the above problems, instead of being formed into one segment in which all code words are connected, at least the propagation of bit errors among segments can be prevented. Here, the greater the number of segments, the more resistant the transmission of data is to bit-errors. However, when the existing arithmetic coding method is applied to each segment, the length of compressed data of a segment is variable, and an accurate boundary cannot be attained for each segment.

In order to solve this problem, each of the compressed code words in a segment can be formed into a different packet, for each of the segments. However, if the number of segments increases, the number of code words in a segment decreases, and the number of packets for transmitting code words increases, which increases overhead in transmitting compressed data and lowers transmission efficiency.

SUMMARY OF THE INVENTION

To solve the above problems, it is an objective of the present invention to provide an arithmetic coding/decoding apparatus and an arithmetic coding/decoding method which incorporates a compression function and resistance to bit-errors by generating a plurality of codes having a plurality of predetermined lengths in each of a plurality of segments without increasing complexity compared to the existing arithmetic encoding method.

To accomplish the above object of the present invention, there is provided a bit-error resistant arithmetic encoding apparatus for generating an encoded bit stream by compressing a plurality of input binary symbols, the arithmetic encoding apparatus having a symbol distribution unit for dividing the plurality of input binary symbols into a plurality of segments and determining the length of a code stream corresponding to each divided segment; a first encoding unit for arithmetically encoding each of the symbols of a divided segment until the encoded length of the code stream is a predetermined length, for each divided segment; a symbol accumulation unit for accumulating binary symbols that are not encoded by the first encoding unit; a second encoding unit for generating a code stream by arithmetically encoding binary symbols stored in the symbol accumulation unit until the encoded length of a code stream is a predetermined length, for each divided segment in which the encoded length of the code stream is less than the predetermined length among the segments arithmetically encoded by the first encoding unit; and a code multiplexing unit for generating the encoded bit stream by multiplexing the plurality of code streams.

It is preferable that the first encoding unit further comprises a plurality of first encoders, which operate independently to each other, each of the first encoders performs arithmetic encoding until the estimated length of a cumulative code stream of the corresponding segment becomes equal to the length of a code stream corresponding to the segment, or until binary symbols allotted to the segment are all encoded, and the second encoding unit further comprises a plurality of second encoders, which sequentially operate and respectively correspond to the plurality of segments, and each of the second encoders receives the estimated length of a cumulative code stream of the corresponding segment from the corresponding first encoders, and performs arithmetic encoding until the estimated length of a cumulative code stream becomes equal to the length of a code stream of the corresponding segment.

To accomplish another object of the present invention, there is also provided a bit-error resistant arithmetic decoding apparatus for generating a data stream of binary symbols by decoding arithmetically encoded code streams, the arithmetic decoding apparatus having a code distribution unit for determining the length of a code stream corresponding to a plurality of segments, and dividing input code streams into a plurality of segments; a first decoding unit for arithmetically decoding the divided code stream until the decoded length of the code stream is a predetermined length, for each segment; a code accumulation unit for accumulating codes which are not decoded in the first decoding unit; a second decoding unit for generating a data stream by arithmetically decoding code streams stored in the code accumulation unit until the decoded length of a code stream is a predetermined length, for each divided segement in which the decoded length of the code stream is less than the predetermined length among the segments arithmetically decoded by the first decoding unit; and a symbol multiplexing unit for generating the data stream by multiplexing the plurality of binary symbols.

It is preferable that the first decoding unit further comprises a plurality of first decoders operating independently to each other, each of the first decoders performing arithmetic decoding until the estimated length of a cumulative code stream of the corresponding segment becomes equal to the length of a code stream corresponding to the segment, or until codes allotted to the segment are all decoded, and the second decoding unit further comprises a plurality of second decoders sequentially operating and respectively corresponding to the plurality of segments, and each of the second decoders receives the estimated length of a cumulative code stream of the corresponding segment from the corresponding first decoders, and performs arithmetic decoding until the estimated length of a cumulative code stream becomes equal to the length of a code stream of the corresponding segment.

To accomplish still another object of the present invention, there is also provided a bit-error resistant arithmetic encoding method for generating a code stream by compressing input binary symbols, the arithmetic encoding method having the steps of (a) dividing input binary symbols into a plurality of segments and determining the length of a code stream corresponding to each divided segment; (b) arithmetically encoding as many divided binary symbols as the amount of the length, in bits, of a code stream corresponding to each segment, for each segment; (c) accumulating binary symbols which are not encoded in the step (b); (d) generating a plurality of code streams, by arithmetically encoding as many binary symbols accumulated in the step (c) as the length, in bits, of a code stream corresponding to each segment until the encoded length of the code stream is a predetermined length, among the segments arithmetic encoded in the step (b); and (e) generating a code stream by multiplexing the plurality of code streams.

To accomplish yet still another object of the present invention, there is also provided a bit-error resistant arithmetic decoding method for generating a data stream of binary symbols by decoding arithmetically encoded code streams, the arithmetic decoding method having the steps of (a) determining the length of a code stream corresponding to a plurality of segments, and dividing input code streams into a plurality of segments; (b) arithmetically decoding the divided code stream as much as the length of a code stream corresponding to each segment for each segment; (c) accumulating codes which are not decoded in the step (b); (d) generating a data stream of a plurality of binary symbols, by arithmetically decoding code streams accumulated in the step (c), as much as the amount of the length of a code stream corresponding to each segment, for each segment which is not decoded as much as the length of a code stream corresponding to the segment, among the segments arithmetic decoded in the step (b); and (e) generating a data stream of binary symbols by multiplexing the plurality of binary symbols.

BRIEF DESCRIPTION OF THE DRAWINGS

The above objectives and advantages of the present invention will become more apparent by describing in detail a preferred embodiment thereof with reference to the attached drawings in which:

FIG. 10 is a flowchart showing the first decoding process of FIG. 4 in more detail;

DETAILED DESCRIPTION OF THE INVENTION

Hereinafter, embodiments of the present invention will be described in detail with reference to the attached drawings. The present invention is not restricted to the following embodiments, and many variations are possible within the spirit and scope of the present invention. The embodiments of the present invention are provided in order to more completely explain the present invention to anyone skilled in the art.

An embodiment of the present invention includes an encoding apparatus for encoding input symbols into bit-error resistant codes and a decoding apparatus for decoding codes generated in the encoding apparatus.

Figure 1:
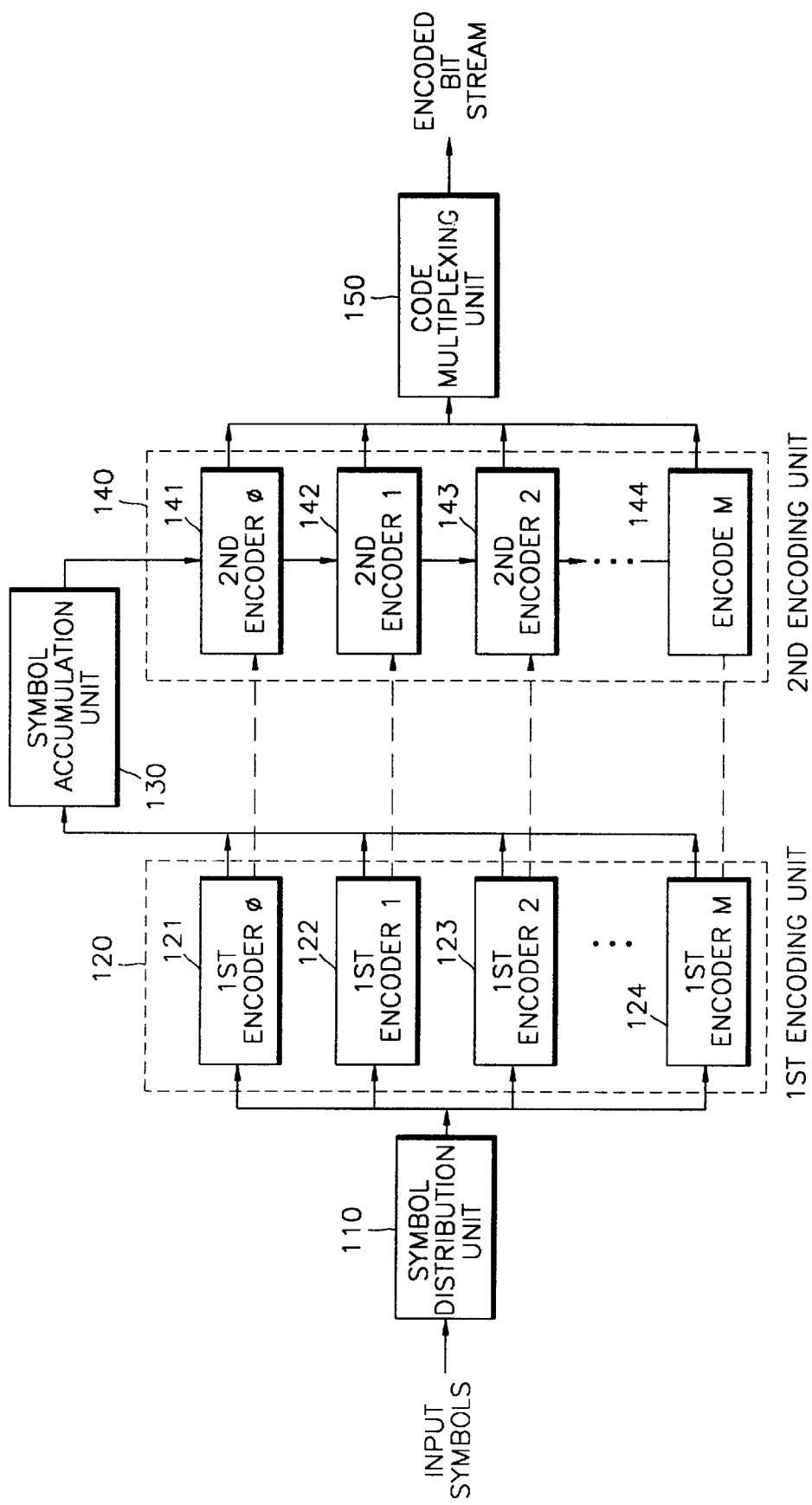
FIG. 1 is a block diagram showing a bit-error resistant arithmetic coding apparatus according to the present invention.

Referring to FIG. 1, an encoding apparatus used in the present invention has a symbol distribution unit 110, a first encoding unit 120, a symbol accumulation unit 130, a second encoding unit 140 for encoding symbols that have not yet been encoded and a code multiplexing unit 150.

The symbol distribution unit 110 divides input symbols (here, symbol means a unit of digital data to be compressed) into a plurality of segments so that each segment includes a predetermined number of input symbols, and determines the length of a code stream to be compressed in each segment's encoder.

The first encoding unit 120 encodes symbols after they have been divided into a plurality of segments and distributed by the symbol distribution unit 110. The first encoding unit 120 can be formed with a plurality of first encoders 121 through 124, which encode corresponding segments in parallel, or with one first encoder, which encodes a plurality of segments sequentially. When the length of a compressed code stream is equal to or longer than a predetermined length corresponding to each segment before all symbols allotted to each segment are compressed, encoding is temporarily stopped and a second encoding process begins.

The symbol accumulation unit 130 accumulates symbols that are not encoded in each segment after passing the first encoding process, and stores the symbols for the second encoding unit 140.

Unlike the first encoding unit 120, the second encoding unit 140 can perform only sequential encoding of all segments. The second encoding unit 140 sequentially encodes these segments that do not fill a corresponding predetermined length in the first encoding process so that not-yet-encoded data stored in the symbol accumulation unit 130 can be encoded in accordance with predetermined lengths. The second encoding unit 140 can be formed with a plurality of second encoders 141 through 144 that perform sequentially, or with one second encoder that encodes a plurality of segments sequentially.

The code multiplexing unit 150 combines the code streams of the respective segments, which are generated by the second encoding unit 140, into one code stream, and passes the code stream to a transmission end.

Figure 2:
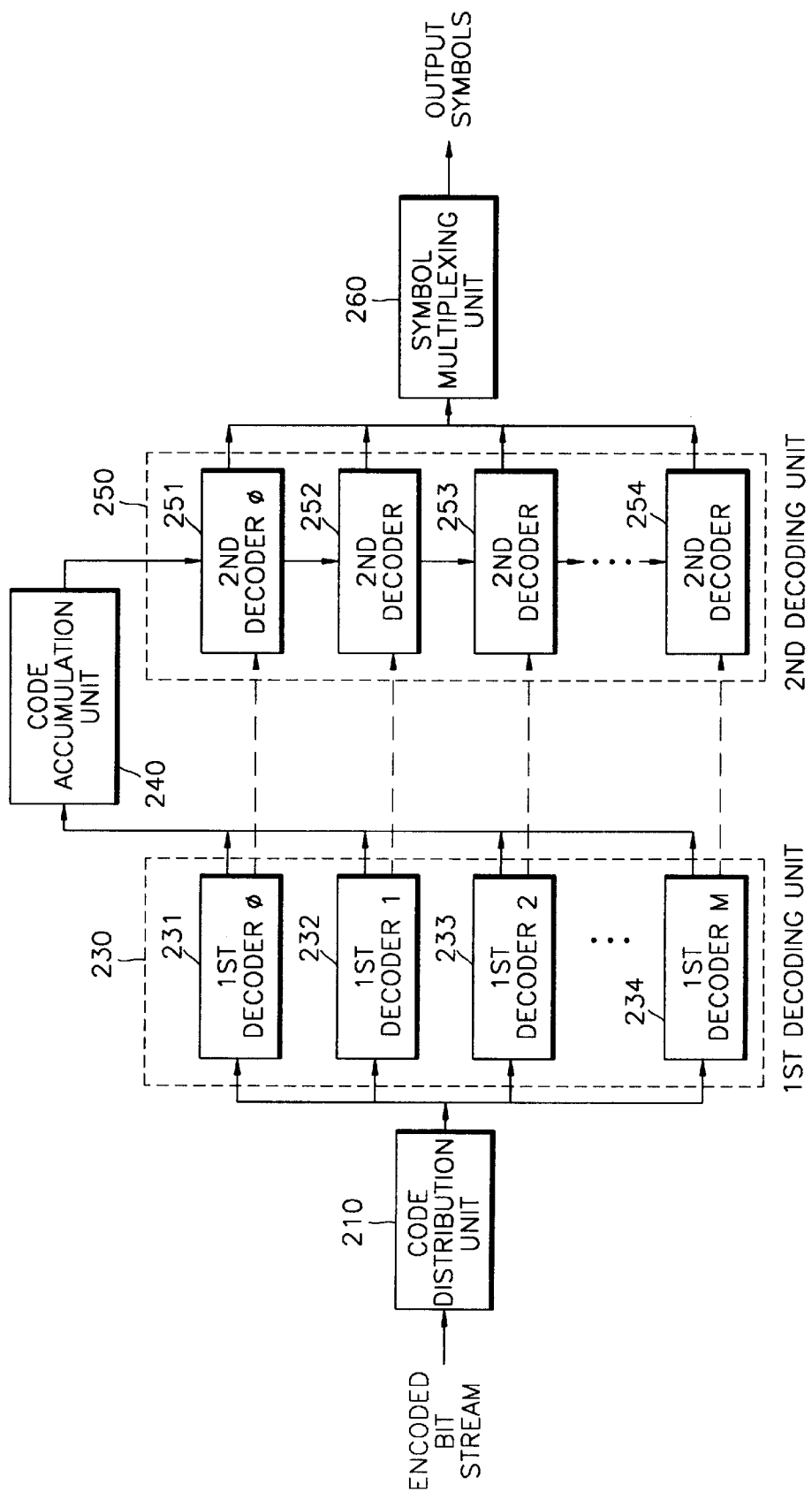
FIG. 2 is a block diagram showing a bit-error resistant arithmetic decoding apparatus according to the present invention.

Referring to FIG. 2, a decoding apparatus used in the present invention has a code distribution unit 210, a first decoding unit 230, a code accumulation unit 240, a second decoding unit 250 for accumulated codes 250 and a symbol multiplexing unit 260.

Similarly to the symbol distribution unit 110 of FIG. 1, the code distribution unit 210 determines the length of compressed codes (here, code means a unit of digital data to be decoded) to be used in each segment's decoder, and divides codes to be decoded into a plurality of segments, so that each segment includes a predetermined number of codes. That is, the code distribution unit 210 divides a code stream into segments according to the length of a compressed code stream to be used in each segment's decoder, and passes the segments to each segment's decoder.

The first decoding unit 230 restores the symbols that were allotted to each segment by using the codes of each of the segments. When the length of a code stream being used in restoration is equal to a predetermined length before all allotted symbols are restored, decoding is stopped.

The code accumulation unit 240 accumulates codes that are not decoded during the decoding process of the first decoding unit 230, and passes them to the second decoding unit 250.

The second decoding unit 250 decodes these codes that are not decoded during the decoding process of the first decoding unit 230 by passing them through each segment's arithmetic decoder sequentially.

The symbol multiplexing unit 260 multiplexes data streams of binary symbols, which are decoded in respective segments, and generates one data stream of binary symbols.

The arithmetic encoding apparatus of FIG. 1 and the arithmetic decoding apparatus of FIG. 2 according to the present invention can be implemented in an application specific IC (ASIC) in which each function block is implemented in the form of hardware, or can be implemented in a combination of a general-purpose computer and software operating on the computer, which can be easily understood to anyone skilled in the art.

The operation of an embodiment of the present invention will now be described.

Figure 3:
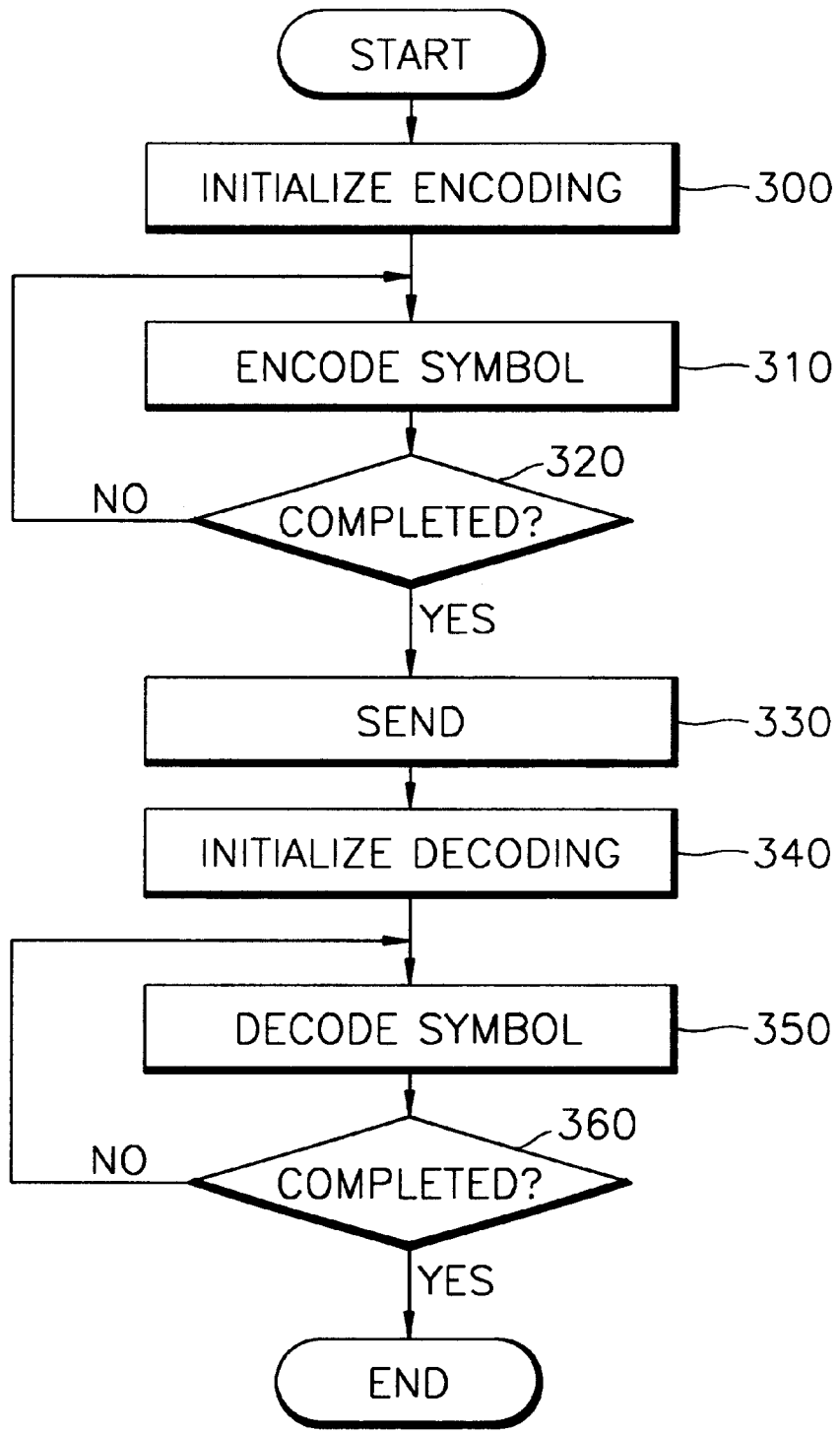
FIG. 3 is a flowchart showing a process for coding and decoding data in general.

FIG. 3 illustrates a generalized process for compressing and restoring digital data in an arithmetic encoding/decoding apparatus. Digital data received from an encoding end are encoded into a bit stream in steps 300 through 320. By encoding digital data using the probability of each data, a compressed bit stream can be more quickly transmitted than the input original digital data. In addition, the compressed bit stream can be stored in a smaller space. A bit stream encoded at an encoding end is sent to a decoding end in step 330. At the decoding end, the encoded bit stream is restored into the original digital data in steps 340 through 360. That is, the decoding end removes changes made in the encoding end.

Figure 4:
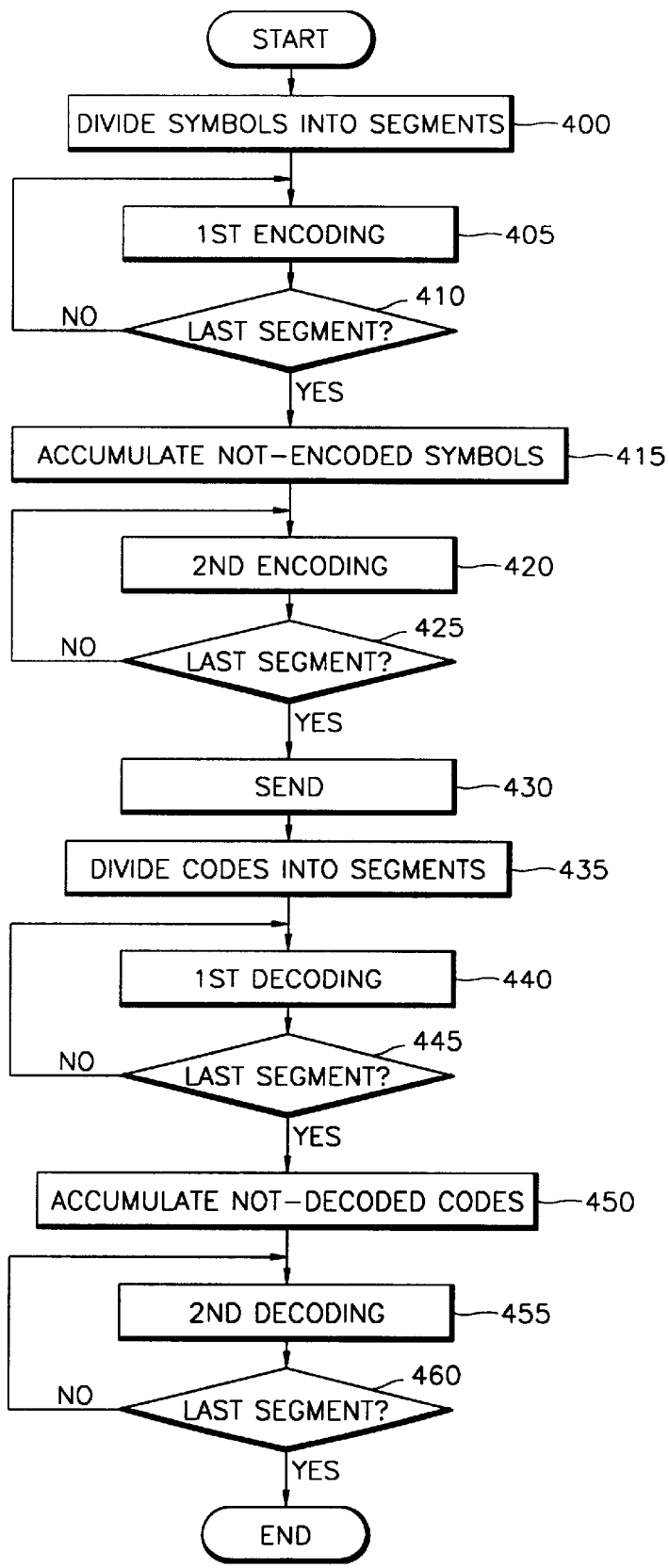
FIG. 4 is a flowchart showing a process for coding and decoding data according to the present invention.

Referring to FIG. 4, a process for compressing digital data to be bit-error resistant using the arithmetic encoding apparatus of FIG. 1 and the arithmetic decoding apparatus of FIG. 2 is shown.

First, binary symbols input in the symbol distribution unit 110 are divided into segments, and the length of a code stream to be compressed in each segment's encoder (A_LEN) is determined in step 400.

Symbols divided by the symbol distribution unit 110 are encoded in corresponding first encoders 121 through 124 in steps 405 and 410. Since the existing arithmetic encoding method is not appropriate for generating bit-error resistant codes, the arithmetic encoding method of FIG. 5 is used in the embodiment of the present invention.

Figure 5:
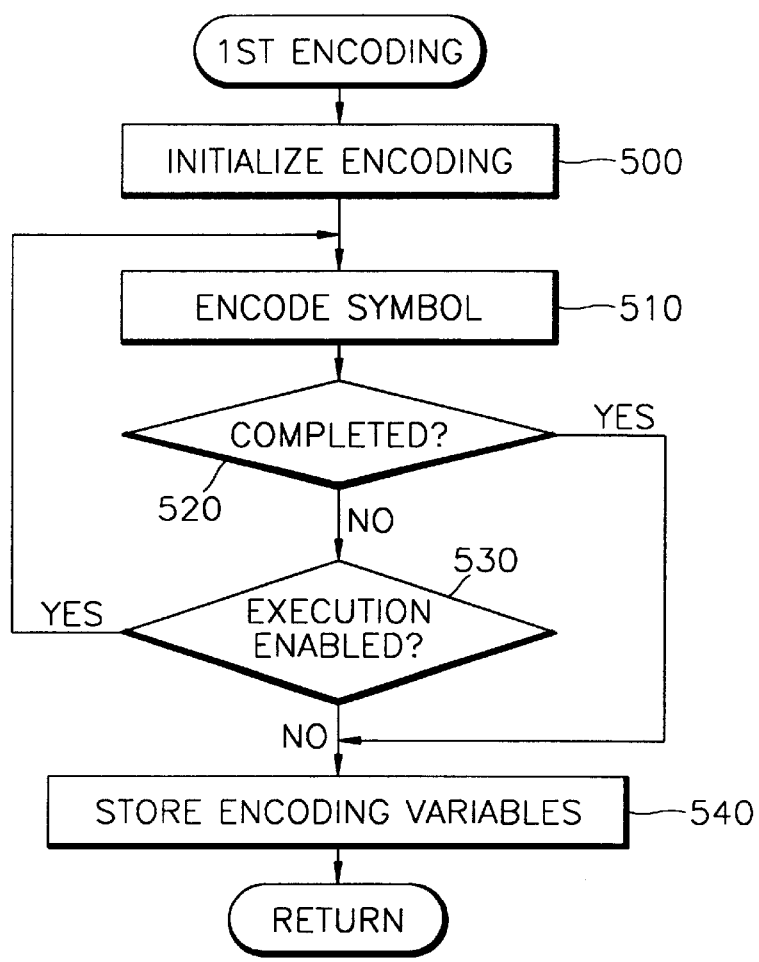
FIG. 5 illustrates the first coding process of FIG. 4 in more detail.

Referring to FIG. 5, an initialization process for the first encoders 121 through 124, each of which is used to encode a corresponding segment, is required. In the initialization process, required variables are set as initial values before actual encoding in step 510.

After initialization, symbols allotted to each segment are arithmetically encoded one by one to generate compressed symbols in step 510.

Since codes of each symbol are connected to each other in the arithmetic encoding method, the length of a code can be obtained as a real number value close to the entropy value. However, since the length of each code cannot be obtained as an accurate integer value, an estimated integer value of the length in the arithmetic encoding process, that is, the estimated length (est_len) of a code, is calculated. By adding the thus-calculated estimated length (est_len) of each symbol, an estimated length of cumulative code stream (cum_est_len) of compressed code stream can be obtained. By comparing the length of the cumulative code stream (cum_est_len) with A_LEN, the encoding possibility of each encoder is determined. That is, symbols allotted to each segment in each first encoder 121 through 124 are compressed until the cumulative length of compressed codes becomes equal to a predetermined length of a code stream for each segment (A_LEN) in step 530.

If the length of a compressed code is longer than A_LEN through the first encoding, a portion which is longer than A_LEN is not multiplexed by the code multiplexing unit 150 and sent to a receiving end, when combining and multiplexing codes of each segment after ending encoding. Therefore, complete encoding cannot be done. After all, the length of the cumulative codes, which are produced in the first encoders 121 through 124, of each of the segments should be shorter or equal to a predetermined length of a code stream of each segment (A_LEN).

In addition, even when all allotted symbols are encoded in each encoder and when the length of cumulative codes is shorter than A_LEN, encoding is temporarily stopped and encoding is resumed in the second encoders in step 520.

In general, the minimum compressed length according to the probability value of a symbol is $-\log_2(\text{Prob})$ by the entropy. If $-\log_2(\text{Prob})$ is greater than the difference between cum_est_len and A_LEN (d_len), a case where the estimated length of cumulative codes when actually encoded, is longer than a predetermined length occurs. Therefore, in order to prevent such a case, the probability value of each symbol is greater than or equal to the minimum probability value (Pmin). The minimum probability value (Pmin) is determined by the difference between cum_est_len and A_LEN (d_len) as shown in equation 1. In general, the probability value is not a real value, but has the resolution of a finite binary number (RES). When d_len is greater than or equal to this RES value, the minimum probability value becomes greater than the resolution value, which makes the minimum probability value meaningless. Therefore, in this case, Pmin is 0.

After all, the minimum probability value (Pmin) is determined by d_len and RES, as shown in equation 1.

$$Pmin = \tfrac{1}{2}^{d\_len} \text{ if } d\_len < RES$$
$$Pmin = 0 \text{ If } d\_len >= RES \quad (1)$$

Due to such restriction, if the probability value of symbol 0 (Prob[0]) is replaced by Pmin when Prob[0] is less than Pmin, the sum of all probability values should be 1, and the probability value of symbol 1 (Prob[1]) becomes (1−Prob[0]).

In the same way, if the probability value of symbol 1 (Prob[1]) is replaced by Pmin when Prob[1] is less than Pmin, the value of Prob[0] becomes (1−Prob[1]). The cumulative probability values of input symbols are always set as CProb[0]=0, CProb[1]=Prob[0], and Cprob[2]=1<<RES.

After the first encoding unit 120 ends its arithmetic encoding of symbols, the second encoding unit 140 begins arithmetically encoding other symbols. Therefore, the variables that are finally used in the first encoding unit are stored in a predetermined location in step 540.

Referring again to FIG. 4, when the encoding by the first encoding unit ends, some segments are completely encoded and some are not be completely encoded. That is, during encoding by the first encoding unit, in the case where the length of the compressed code of a segment reaches the predetermined length associated with that segment, some symbols of the segment are left over, i.e., some symbols are not encoded. In the case where the length of the compressed code of a segment has not reached the predetermined length associated with that segment upon completion of encoding for all symbols allocated to the segment, there is some room left in the segment for additional encoding. In order to solve the difference problem, symbols that are not encoded after the first encoding process are accumulated in one place in step 415.

In the second encoding unit 140, thus-accumulated symbols are encoded in steps 420 and 425. This process is described in FIG. 6 in detail.

Figure 6:
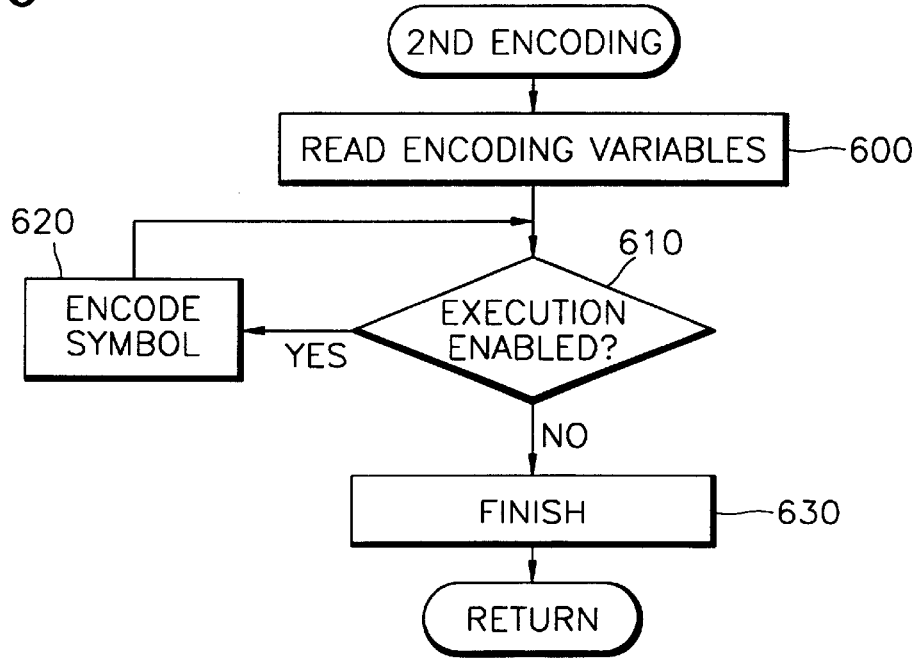
FIG. 6 illustrates the second coding process of FIG. 4 in more detail.

Referring to FIG. 6, first, variables stored in the step 540 in FIG. 5 are read in step 600. As long as the estimated length of the cumulative code stream of a segment is shorter than the predetermined length associated with that segment, the second encoding process is performed for the segment in steps 610 and 620. When all symbols accumulated in the step 415 of FIG. 4 are encoded, the second arithmetic encoding ends. At this time, unlike the first encoding unit 120 in which the encoding order of segments need not be considered because the encoding process of each segment is performed independently, the second encoding unit 140 encodes symbols that are not encoded, and sequentially performs the encoding process of each segment. By doing so, symbols that are not encoded in the first encoding process are encoded in the second encoding unit and all input symbols are encoded.

Though encoding is stopped when the estimated length of a cumulative code stream becomes equal to the predetermined length associated with a segment, the length of a code stream actually output is shorter than the estimated length. Therefore, a finishing process of encoding is necessary in order to restore the original symbol in a decoding unit in step 630.

Referring again to FIG. 4, a code stream is made by multiplexing in the code multiplexing unit 150 the code stream of each segment generated by the above procedures, and sent to a receiving unit in step 430.

Figure 7:
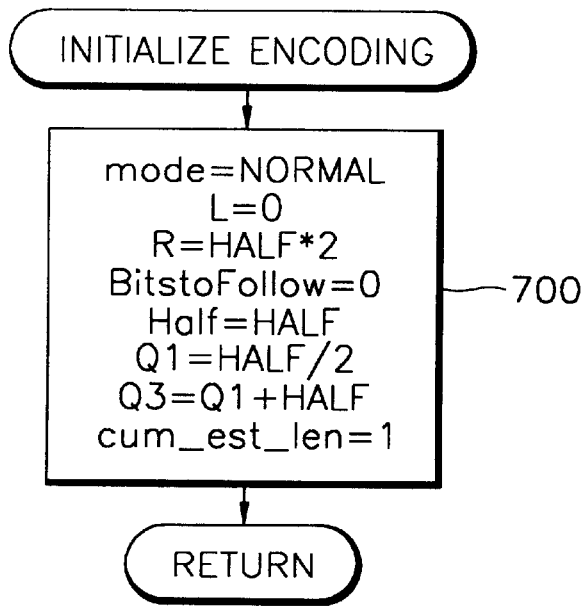
FIG. 7 illustrates the coding initialization process of FIG. 5 in more detail.

FIG. 7 illustrates the coding initialization process (step 500) of FIG. 5 in more detail. Referring to FIG. 7, when state variables required for arithmetic encoding are defined so that the type of encoding is defined as mode; the lower limit of code located in the total probability region is defined as L; the range of code location is defined as R; the number of bits to be additionally output is defined as BitstoFollow; a location which is at ½ point in the total probability sector is defined as Half; a location which is at ¼ point in the total probability sector is defined as Q1; a location which is at ¾ point in the total probability sector is defined as Q3; and the estimated length of a cumulative code stream is defined as cum_est_len, the initialization process initializes the state variables in step 700 as follows:

mode=NORMAL
L=0
R=HALF*2
BitstoFollow=0
Half=HALF
Q1=HALF/2
Q3=Q1+HALF
cum_est_len=1.

Here, HALF is the location which is at ½ in the total probability sector in general types, and its value is defined as 1<<(RES-1), where RES is the resolution of probability and << represents left shift operation.

Figure 8:
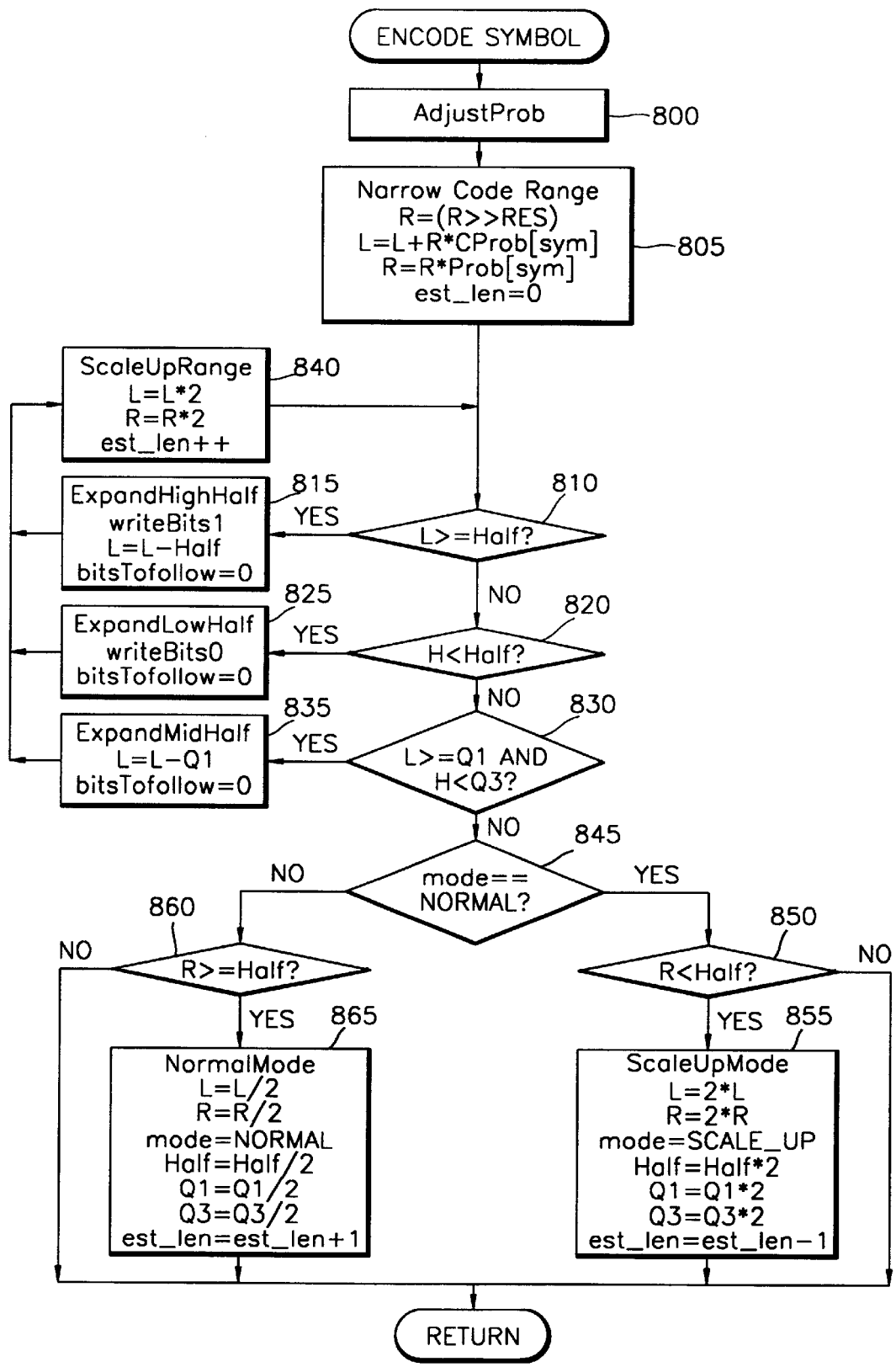
FIG. 8 is a flowchart showing the symbol encoding processes of FIGS. 5 and 6 in more detail.

FIG. 8 illustrates the symbol encoding processes (steps 510 and 620) of FIGS. 5 and 6 in more detail.

Referring to FIG. 8, first, the probability value of a symbol to be encoded is calculated in step 800. Then, according to the probability value, first, the range of code location (R) is narrowed, and the lower limit of code location is reset in step 805. According to the thus-reset L value, a segment of a code to be expanded is determined. First, when the L value is greater than or equal to Half, the high half is expanded in steps 810 and 815. When the H (=L+R) value is less than Half, the lower half is expanded in steps 820 and 825. When the L value is greater than or equal to Q1, and the H (=L+R) value is less than Q3, the half located in the middle is expanded in steps 830 and 835. After the range of code location is expanded as described above, the L value and the R value are doubled in step 840, and the previous expansion process is again performed. Then, the steps are repeated.

When the conditions of the steps 810, 820 and 830 are not satisfied, the arithmetic encoding process is ended. When the encoding mode is NORMAL, and the R value is less than Half, the encoding mode changes into a SCALE_UP mode in steps 845, 850 and 855. At this time, related variables (L, R, Half, Q1, Q3) are all doubled. However, when the encoding mode is SCALE_UP, and the R value is greater than or equal to Half, the encoding mode changes into NORMAL in steps 845, 860, and 865. Surely, related variables (L, R, Half, Q1, Q3) are scaled down by half.

Each step of FIG. 8 will now be described in detail.

In a probability value adjusting step (AdjustProb) 800, the probability value of each symbol is restricted to be greater than or equal to the minimum value (Pmin) so that the cumulative estimated length of the compressed code stream of a segment is not greater than the predetermined length associated with the segment (A_LEN). Here, the minimum value is determined by the equation 1.

In a code range narrowing step (NarrowCodeRange) 805, the range of code location which is expressed as a binary number, is shifted to the right as much as the resolution of the probability value (RES) (shift right), the range of code location (R) is multiplied by a cumulative probability value of a symbol input, and then, the lower limit of code location (L) is added. Next, by multiplying the range of code location (R) by the probability value of a symbol, the range of code location is narrowed by as much as the probability value of a symbol, and the estimated length of a code is initialized to "0", before the estimated length of a code which is used in compressing symbols is obtained.

In a high half expanding step (ExpandHighHalf) 815, Half is subtracted from the lower limit of code location (L), and because the high half is expanded, a logic "1" value is output to a code stream. Also, as many "0" values as the number of additional output bits (BitsToFollow) are additionally output to a code stream, and the number of additional output bits (BitsToFollow) is initialized to "0".

In a lower half expanding step (ExpandLowHalf) 825, the lower limit of code location (L) does not change, and a logic "0" value is output to a code stream. Also, as many logic "1" values as the number of additional output bits (BitsToFollow) are additionally output to a code stream, and the number of additional output bits (BitsToFollow) is initialized to "0".

In a mid-half expanding step (ExpandMidHalf) 835, Q1 is subtracted from the lower limit of code location (L). Also, when the mid-half is expanded, then since it is not determined whether the logic value of a code to be output is "0" or "1", output is withheld, and instead, the number of additional output bits (BitsToFollow) is increased by 1.

Next, in order to complete the half expansions in steps 815, 825 and 835, the actual ranges are set to predetermined sizes in a code range scale-up step (ScaleUpRange) 840. That is, the lower limit of the code location (L) is doubled, and the range of code location (R) is doubled. Also, since the length of a compressed code is incremented by 1 whenever the range of code location is doubled, the estimated length of a code (est_en) is incremented by 1.

When an encoding mode (coding_mode) is a normal mode (Normal) and the range of the code location (R) is less than Half, all variables are doubled to increase the resolution by 1 bit in a scale-up mode changing step (ScaleUpMode) 855 so that the encoding mode (coding_mode) changes into a scale-up mode (ScaleUp), and the estimated length of a code (est_len) is decremented by 1.

When an encoding mode (coding_mode) is a scale-up mode (ScaleUp) and the range of the code location (R) is greater than or equal to Half, all variables used are halved in a normal mode changing step (NormalMode) 865 to decrease the resolution by 1 bit so that the encoding mode (coding_mode) changes into a normal mode (Normal), and the estimated length of a code (est_len) is incremented by 1.

Figure 9:
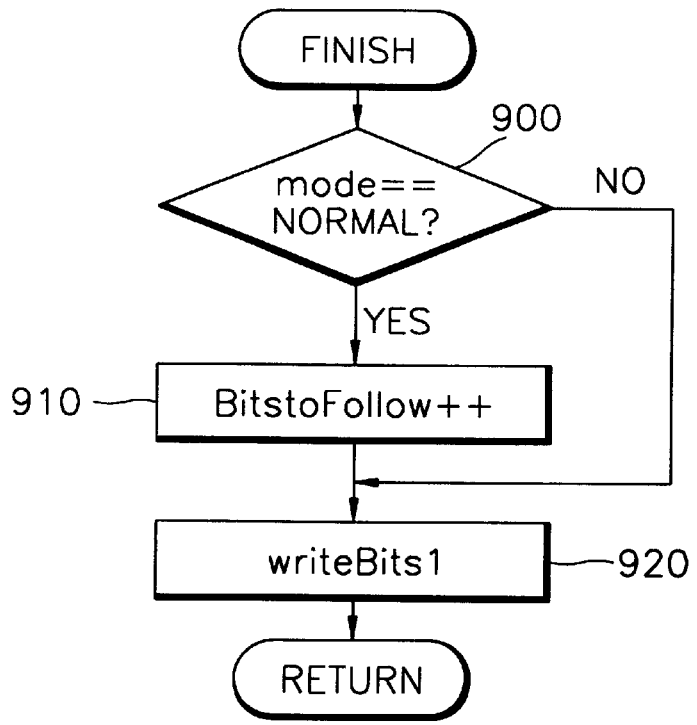
FIG. 9 is a flowchart showing the finishing process of FIG. 6 in more detail.

FIG. 9 illustrates the finishing process of FIG. 6 in more detail. In the finishing process, when an encoding mode is a normal mode, the number of additional output bits (BitsToFollow) is incremented by 1 in steps 900 and 910. Then, a logic "1" value followed by as many logic "0" values as the number of additional output bits (BitsToFollow), are output additionally to a code stream in step 920.

Referring again to FIG. 4, when a code stream sent in the step 430 is received by a receiving unit, the code distribution unit 210 determines the length of a code stream (A_LEN) to be used in decoding codes in the decoder of each segment, and divides an input code stream according to the length (A_LEN) value corresponding to each segment, and sends each code stream to a first decoder of each segment 231 through 234 in step 435.

Codes divided by the code distribution unit 210 are decoded by the first decoder of each segment corresponding to each divided code in steps 440 and 445.

Existing arithmetic decoding is not appropriate for making a bit-error resistant structure. Therefore, the arithmetic decoding shown in FIG. 10 is used in the present invention.

Referring to FIG. 10, an initialization process is required for each first encoder 231 through 234, before decoding each code. In the initialization process, variables that are necessary are set at initial values before decoding in step 1000.

Also, a surplus code is read in order to restore original symbols correctly due to the characteristics of arithmetic encoding, and encoding is performed in such a way that correct values are restored when the surplus value is "0". Therefore, a process for adding 32 "0" bits to each code stream allotted to each segment is necessary in step 1010.

Next, the code allotted to each segment is sequentially, arithmetically decoded and symbols are generated in step 1020. The first decoders 231 through 234 use the probability value of each symbol that were used in compression by the arithmetic encoders. The estimated length of a code which was used in decompressing codes is also calculated in the first decoders 231 through 234. The estimated length of a code thus-calculated must be equal to the estimated length of a code which is compressed from a symbol. By adding thus-calculated est_len values, the estimated length of a cumulative code stream (cum_est_len) is obtained. By comparing the estimated length of a cumulative code stream with A_LEN, the possibility of decoding in each decoder is determined. That is, the first decoders 231 through 234 decodes codes allotted to each segment until the estimated length of a cumulative code stream of a compressed code (cum_est_len) becomes equal to A_LEN in step 1040.

In addition, when each of the decoders 231 through 234 decodes all allotted codes, decoding is temporarily stopped even when the estimated length of a cumulative code stream is less than A_LEN, and then, the second encoders begin decoding continuously in step 1030.

In general, the minimum compressed length according to the probability value of a symbol is $-\log_2(\text{Prob})$ by the entropy. If $-\log_2(\text{Prob})$ is greater than the difference between cum_est_len and A_LEN, a case occurs in which the estimated length of cumulative codes when actually decoded, is longer than a predetermined length. Therefore, in order to prevent such a case, the probability value of each symbol is greater than or equal to the minimum probability value (Pmin). The minimum probability value (Pmin) is determined by the difference between cum_est_len and A_LEN (d_len) as shown in equation 2. In general, the probability value is not an integer value, but has the resolution of a finite binary number (RES). When d_len is greater than or equal to the RES value, the minimum probability value becomes greater than the resolution value, which makes the minimum probability value meaningless. Therefore, in this case, Pmin is 0. After all, the minimum probability value (Pmin) is determined by d_len and RES, as shown in equation 2.

$$P\text{min} = \tfrac{1}{2}^{d\_len} \text{ if } d\_len < RES$$

$$P\text{min} = 0 \text{ If } d\_len >= RES \qquad (2)$$

Due to such a restriction, if the probability value of symbol 0 (Prob[0]) is replaced by Pmin when Prob[0] is less than Pmin, the sum of all probability values should be 1, and the probability value of symbol 1 (Prob[1]) becomes (1−Prob[0]).

In the same way, if the probability value of symbol 1 (Prob[1]) is replaced by Pmin when Prob[1] is less than Pmin, the value of Prob[0] becomes (1−Prob[1]). The cumulative probability values of input symbols are always set as CProb[0]=0, CProb[1]=Prob[0], and Cprob[2]=1<<RES.

After the first decoding unit 230 ends its arithmetic decoding of codes, the second decoding unit 250 begins arithmetic decoding of other codes. Therefore, the variables that are finally used in the first decoding unit are stored in a predetermined location in step 1050.

Referring again to FIG. 4, when the decoding by the first decoding unit ends, some segments are completely decoded and some are not be completely decoded. That is, during decoding by the first decoding unit, in the case where the length of the cumulative code stream reaches the predetermined length associated with that segment, some codes of the segment are left over, i.e., some codes are not decoded. In the case where the length of the code stream of a segment has not reached the predetermined length associated with that segment upon completion of decoding for all codes allocated to the segment, there is some room left in the segment for additional decoding. In order to solve the difference problem, codes that are not decoded after the first decoding process are accumulated in one place in step 450.

In the second decoding unit 250, the thus-accumulated codes are decoded in steps 455 and 460. This process is described in FIG. 11 in detail.

Figure 11:
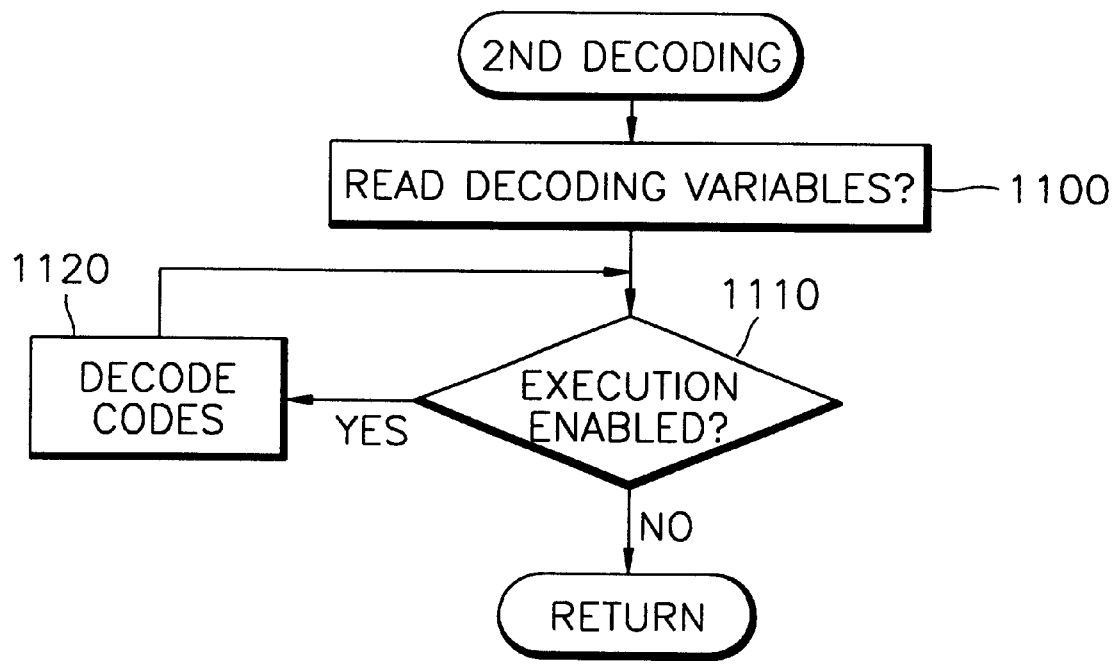
FIG. 11 is a flowchart showing the second decoding process of FIG. 4 in more detail.

Referring to FIG. 11, first, variables stored in the step 1050 in FIG. 10 are read in step 1100. As long as the estimated length of the cumulative code stream of each segment is shorter than the predetermined length of the code stream of each segment, the second decoding process is performed in each segment in steps 1110 and 1120. When all codes accumulated in the step 450 of FIG. 4 are decoded, the second arithmetic decoding ends. At this time, unlike the first decoding unit 230 in which the decoding order of segments need not be considered because the decoding process of each segment is performed independently, the second decoding unit 250 decodes those codes, which are not decoded, and sequentially performs the decoding process of each segment. By doing so, codes that are not decoded in the first decoding process are decoded in the second decoding unit and all allotted codes are decoded.

Figure 12:
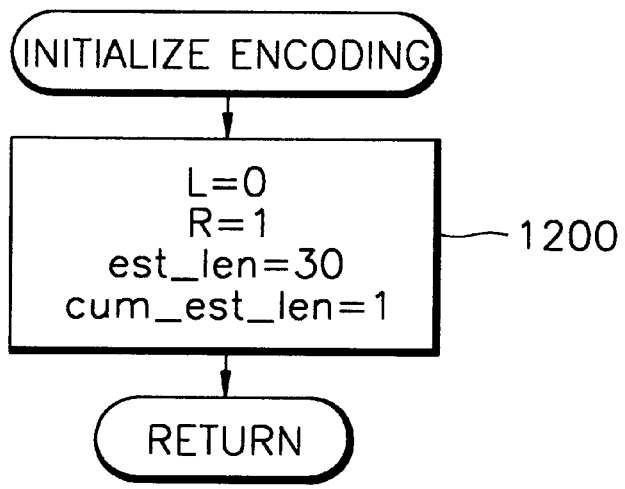
FIG. 12 is a flowchart showing the initialization process of the decoding process of FIG. 10 in more detail.

FIG. 12 illustrates the decoding initialization process (step 1050) of FIG. 5 in more detail. Referring to FIG. 12, when state variables required for arithmetic decoding are defined so that the lower limit of code location is defined as L; the range of code location is defined as R; the estimated length of a code which is used in restoring a symbol is defined as est_len; and the estimated length of a cumulative code stream is defined as cum_est_len, the initialization process initializes the state variables in step 1200 as follows:

L=0
R=1
est_len=30
cum_est_len=1.

Figure 13:
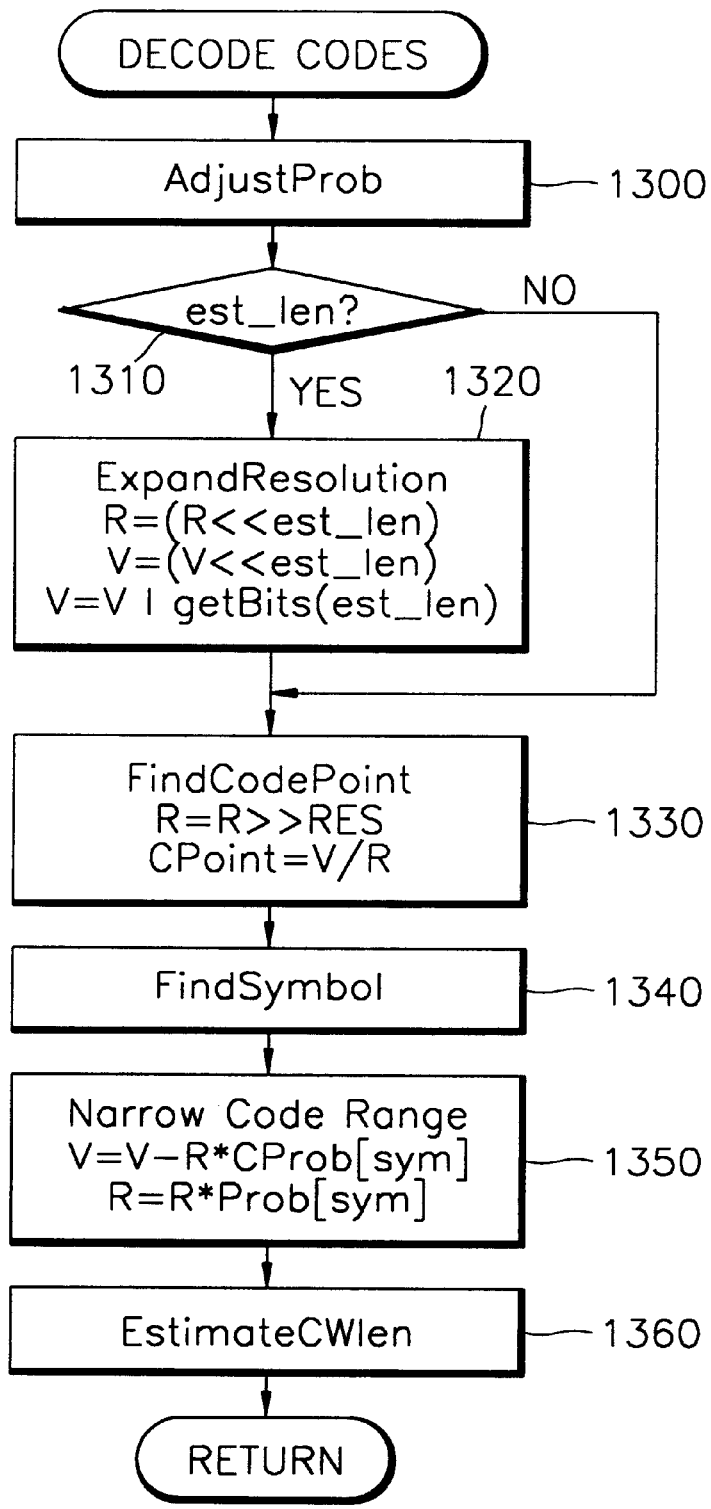
FIG. 13 is a flowchart showing the code decoding processes of FIGS. 10 and 11 in more detail.

FIG. 13 illustrates the code decoding processes (steps 1020 and 1120) of FIG. 10 and FIG. 11.

Referring to FIG. 13, probability values to be used in decompression are restricted in step 1300 so that the estimated length of a cumulative code stream to be used in decompression is not longer than the predetermined length of a code stream. Then, according to the estimated length of a code (est_len), which is estimated to be used in decoding the previous code, the range of code location (R) required for decoding is expanded, the code value (V) is expanded, and as many bits as required in an input code stream are read in steps 1310 and 1320. The step 1310 is for skipping the step 1320. Then, in sequence the location of a code (Cpoint) is calculated from an actual probability value in step 1330, the probability value to restore a symbol is calculated in the same process of the encoders, and symbols are restored according to the Cpoint value and the probability value in step 1340. After restoring symbols, the restored symbols are used in reducing the range of codes in order to restore the next symbol in step 1350. Next, the estimated length of the code, which was used finally in restoring a symbol is calculated in step 1360. The value calculated at this time must be the same as the value calculated in the arithmetic encoder.

Each step of FIG. 13 will now be described in detail.

In a probability value adjusting step (AdjustProb) 1300, the probability value of each symbol is restricted to be greater than or equal to the minimum value (Pmin) so that the estimated value of a cumulative code stream that was used during decompression does not become greater than the predetermined length of a code stream for each segment. Here, the minimum value (Pmin) is determined by the equation 2.

In a resolution expansion step (ExpandResolution) 1320, the range of the code location (R) is shifted left by the amount est_len by bit calculation (shift left); the code value (V) is shifted left by the amount est_len by bit calculation; and then, as many bits as est_len are additionally read from a code stream and added to the code value so that a resolution is expanded.

In the code location search step (FindCodePoint) 1330, the range of the code location (R) is shifted right by an amount corresponding to the resolution value of the probability value (RES bit) by bit calculation (shift right). Then, a code location (Cpoint) which represents relative distance of a code value in the range of code location (R) is calculated by dividing a code value (V) by the range of code location (R).

Figure 14:
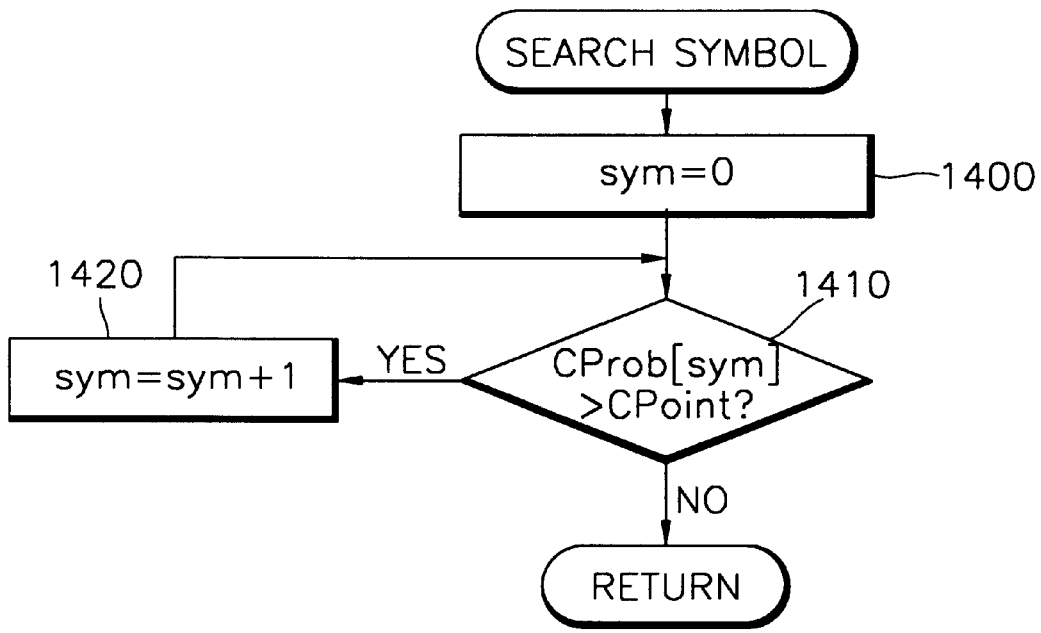
FIG. 14 is a flowchart showing the symbol access process of FIG. 13 in more detail.

The symbol search step (FindSymbol) 1340 is shown in FIG. 14 in detail.

Referring to FIG. 14, first, a symbol to be restored (sym) is initialized to "0" in step 1400. Next, code locations (Cpoint) and cumulative probability values are compared with each other sequentially, and when a cumulative probability value is greater than Cpoint, sym is incremented by 1. Until the cumulative probability values are less than or equal to Cpoint, this comparison and increment process is repeated so that a symbol to be restored is searched in steps 1410 and 1420.

In the code range narrowing step (NarrowCodeRange) 1350, a value, which is obtained by multiplying the range of the code location (R) by the cumulative probability value which is indicated by a restored symbol, is subtracted from a code value (V). Then, with the result, a code value is updated, and the range of the code location is multiplied by the probability value of a symbol (Prob) so that the range of the code location is narrowed by as much as the probability value of a symbol.

Figure 15:
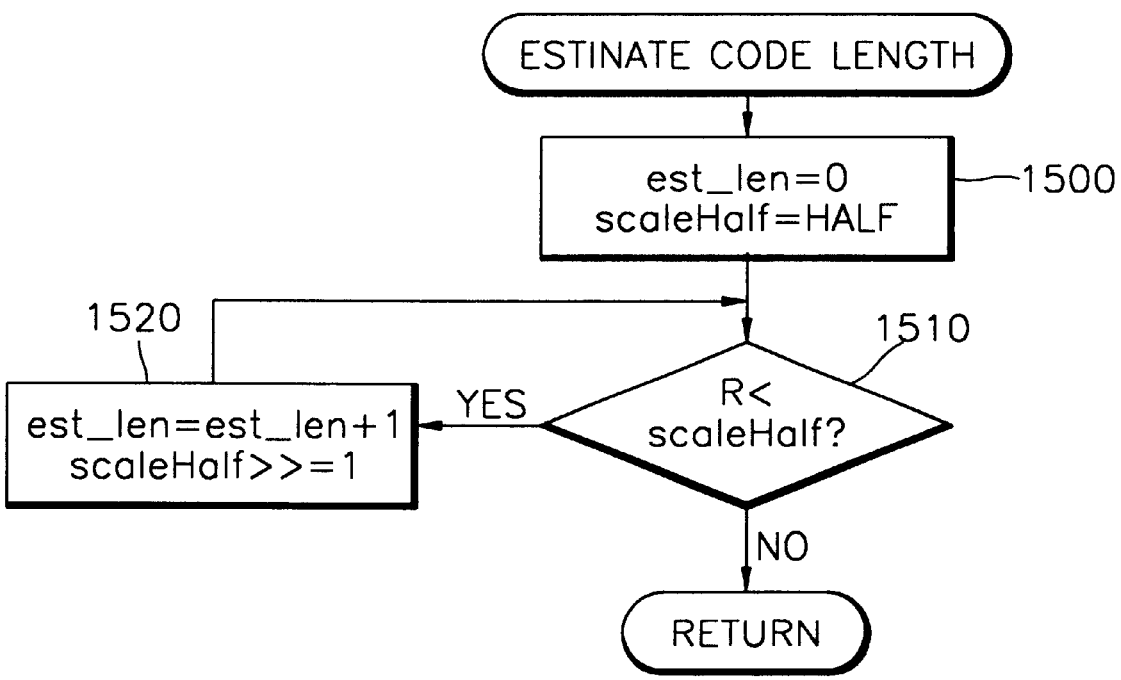
FIG. 15 is a flowchart showing the code length estimation process of FIG. 13 in more detail.

The code length estimation step (EstimateCWlen) 1360 is shown in FIG. 15 in detail. Referring to FIG. 15, first, est_len is initialized at "0" in order to obtain the estimated length of a code, which was used in decoding, in step 1500. Until the first "1" comes, est_len is incremented by 1 from the highest bit to the lowest bit in the range of the code location (R) for search.

Figure 16:
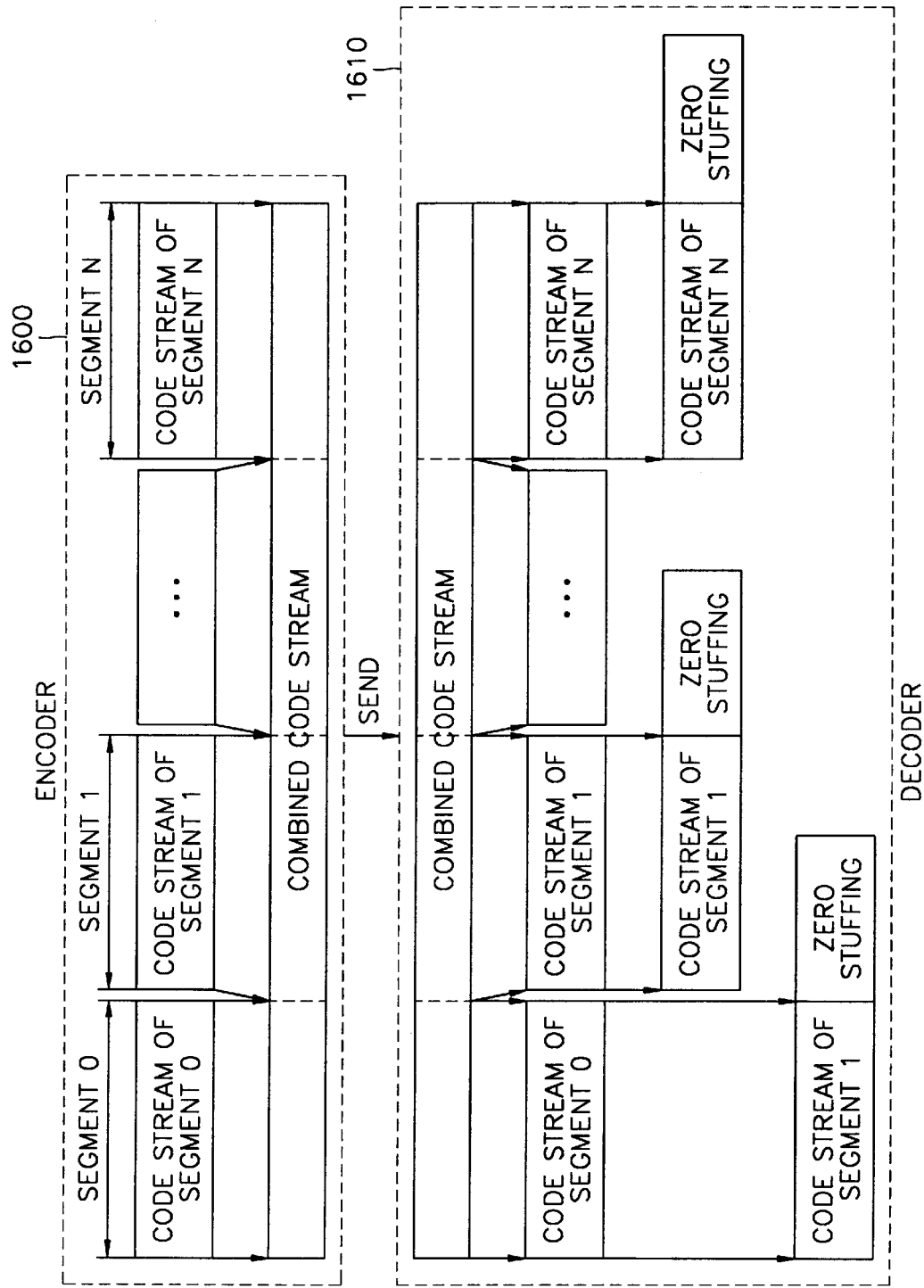
FIG. 16 illustrates the bit-error resistant code stream according to the present invention.

FIG. 16 illustrates the structure of a code stream that has been arithmetically encoded by encoders 1600 and the structure of a code stream before it has been arithmetically decoded by decoders 1610 according to the present invention.

Meanwhile, the invention may be embodied in a general purpose digital computer by running a program from a computer usable medium, including but not limited to storage media such as magnetic storage media (e.g., ROM's, floppy disks, hard disks, etc.), optically readable media (e.g., CD-ROMs, DVDs, etc.) and carrier waves (e.g., transmissions over the Internet). Hence, the present invention may be embodied as a computer usable medium.

The computer readable recording medium includes a program which executes a first arithmetic encoding module for arithmetically encoding symbols of each segment independently, having (a1) an initialization module for initializing state variables which are required in the arithmetic encoding of each segment; (a2) a first symbol encoding module for arithmetically encoding symbols input in the unit of a segment using the state variables initialized by the initialization module in the unit of a segment, until the estimated length of a cumulative code stream which accumulates the estimated length of each symbol becomes equal to the length of a code stream corresponding to the segment, or until binary symbols allotted to a segment are all encoded; and (a3) a state variable storage module for temporarily storing state variables from the first symbol encoding module which ends arithmetic encoding in the unit of a segment; and executes a second arithmetically encoding module for sequentially, arithmetic encoding each segment, having (b1) a state variable restoration module for restoring state variables stored in the state variable storage module; (b2) a second symbol encoding module for encoding binary symbols that are not encoded in the first arithmetic encoding module until the estimated length of a cumulative code stream restored by the state variable restoration module becomes equal to the length of a code stream corresponding to the segment; and (b3) an arithmetic encoding finishing module for generating a code stream of the corresponding segment by determining the number of bits to be additionally output.

In the computer readable recording medium, when the type of encoding is defined as mode; the lower limit of code location in the total probability sector is defined as L; the range of code location, as R; the number of bits to be additionally output is defined as BitstoFollow; a location which is at ½ point in the total probability sector is defined as Half; a location which is at ¼ point in the total probability sector is defined as Q1; a location which is at ¾ point in the total probability sector is defined as Q3; and the estimated length of a cumulative code stream is defined as cum_est_len, the program executes the initialization module in which state variables are initialized as:

mode=NORMAL
L=0
R=HALF*2
BitstoFollow=0
Half=HALF
Q1=HALF/2
Q3=Q1+HALF
cum_est_len=1.

In the recording medium, each of the first symbol encoding module and the second symbol encoding module has a probability value adjusting module for restricting the probability value of each symbol to be greater than or equal to the minimum value so that the estimated length of the cumulative code stream is not greater than the length of a code stream corresponding to a segment; a code range narrowing module for narrowing the range of code location by as much as the probability value of a symbol; a code range scale-up module for repeating scaling up the high half of the range of a code when the lower limit of the code location (L) is greater than or equal to Half, scaling up the lower half of the range of code when the upper limit of the code location (L+R) is less than Half, and scaling up the mid-half of the range of code when the lower limit of code location is greater than or equal to Q1 and the upper limit of the code location is less than Q3; an encoding mode changing module for changing an encoding mode into a scale-up mode by increasing all the variables by two times to increase the resolution by 1 bit when an encoding mode is a normal mode and the range of code location (R) is less than Half, and changing an encoding mode into a normal mode by decreasing all the variables by half to decrease the resolution by 1 bit when an encoding mode is a scale-up mode and the range of the code location (R) is greater than or equal to Half.

In the recording medium, if the difference value of the length of a code stream corresponding to the segment and the estimated length of a cumulative code stream is d_len, the minimum value of the probability adjusting module is determined to be $\frac{1}{2}^{d\_len}$ when the difference value is less than the resolution of a probability value, and otherwise, is determined to be 0.

The computer readable recording medium includes a program which executes a first arithmetic decoding module for arithmetically decoding codes of each segment independently, having (a1) an initialization module for initializing state variables which are required in the arithmetic decoding of each segment; (a2) a binary-0 addition module for binary adding a predetermined number of "0"s to a code stream allotted to each segment; (a3) a first code decoding module for arithmetic decoding code streams input in the unit of a segment using the state variables initialized by the initialization module in the unit of a segment, until the estimated length of a cumulative code stream which accumulates the estimated length of each code becomes equal to the length of a code stream corresponding to the segment, or until codes allotted to a segment are all decoded; and (a4) a state variable storage module for temporarily storing state variables from the first code decoding module which ends arithmetic decoding in the unit of a segment; and executes a second arithmetic decoding module for sequentially, arithmetic decoding each segment, having (b1) a state variable restoration module for restoring state variables stored in the state variable storage module; and (b2) a second code decoding module for decoding binary codes which are not decoded in the first arithmetic decoding module until the estimated length of a cumulative code stream restored by the state variable restoration module becomes equal to the length of a code stream corresponding to the segment.

The functional modules for implementing the present invention can be derived by a skilled computer programmer from the description of the invention contained herein.

According to the present invention, first, input binary symbols are divided into a plurality of independent segments, and the plurality of segments form respective code streams, which prevent propagation of bit errors to other segments. By doing so, resistance to bit-error as well as a compression function is achieved, which can be effectively used in environments where many bit errors are greatly occur, for example, mobile communications networks, satellite broadcasts and digital broadcasts.

Second, the coding/decoding apparatus of the present invention enables to the estimated length of a code stream occurring in encoding each symbol or the estimated length of a code stream used in decoding to be easily calculated, which enables a lower complexity arithmetic encoder/decoder.

Third, the length of a compressed code stream is variable in previous arithmetic encoding, but, according to the present invention any length of a code stream can be made as designers want.

What is claimed is:

1. A bit-error resistant arithmetic encoding apparatus for generating an encoded bit stream by compressing a plurality of input binary symbols, the arithmetic encoding apparatus comprising:
    a symbol distribution unit for dividing the plurality of input binary symbols into a plurality of segments and determining the length of a code stream corresponding to each divided segment;
    a first encoding unit for arithmetically encoding each of the symbols of a divided segment until the encoded length of the code stream is a predetermined length, for each divided segment;
    a symbol accumulation unit for accumulating binary symbols that are not encoded by the first encoding unit;
    a second encoding unit for generating a code stream by arithmetically encoding binary symbols stored in the symbol accumulation unit until the encoded length of a code stream is a predetermined length, for each divided segment in which the encoded length of the code stream is less than the predetermined length among the segments arithmetically encoded by the first encoding unit; and
    a code multiplexing unit for generating the encoded bit stream by multiplexing the plurality of code streams.

2. The bit-error resistant encoding apparatus of claim 1, wherein the first encoding unit further comprises a plurality of first encoders, which operate independently to each other, each of the first encoders performs arithmetic encoding until the estimated length of a cumulative code stream of the corresponding segment becomes equal to the length of a code stream corresponding to the segment,
or until binary symbols allotted to the segment are all encoded, and the second encoding unit further comprises a plurality of second encoders, which sequentially operate and respectively correspond to the plurality of segments, and each of the second encoders receives the estimated length of a cumulative code stream of the corresponding segment from the corresponding first encoders, and performs arithmetic encoding until the estimated length of a cumulative code stream becomes equal to the length of a code stream of the corresponding segment.

3. A bit-error resistant arithmetic decoding apparatus for generating a data stream of binary symbols by decoding arithmetically encoded code streams, the arithmetic decoding apparatus comprising:
    a code distribution unit for determining the length of a code stream corresponding to a plurality of segments, and dividing input code streams into a plurality of segments;
    a first decoding unit for arithmetically decoding the divided code stream until the decoded length of the code stream is a predetermined length, for each segment;
    a code accumulation unit for accumulating codes which are not decoded in the first decoding unit;
    a second decoding unit for generating a data stream by arithmetically decoding code streams stored in the code accumulation unit until the decoded length of a code stream is a predetermined length, for each divided segment in which the decoded length of the code stream is less than the predetermined length among the segments arithmetically decoded by the first decoding unit; and
    a symbol multiplexing unit for generating the data stream by multiplexing the plurality of binary symbols.

4. The bit-error resistant decoding apparatus of claim 3, wherein the first decoding unit further comprises a plurality of first decoders operating independently to each other, each of the first decoders performing arithmetic decoding until the estimated length of a cumulative code stream of the corresponding segment becomes equal to the length of a code stream corresponding to the segment, or until codes allotted to the segment are all decoded, and the second decoding unit further comprises a plurality of second decoders sequentially operating and respectively corresponding to the plurality of segments, and each of the second decoders receives the estimated length of a cumulative code stream of the corresponding segment from the corresponding first decoders, and performs arithmetic decoding until the estimated length of a cumulative code stream becomes equal to the length of a code stream of the corresponding segment.

5. A bit-error resistant arithmetic encoding method for generating a code stream by compressing input binary symbols, the arithmetic encoding method comprising the steps of:
    (a) dividing input binary symbols into a plurality of segments and determining the length of a code stream corresponding to each divided segment;
    (b) arithmetically encoding as many divided binary symbols as the amount of the length, in bits, of a code stream corresponding to each segment, for each segment;
    (c) accumulating binary symbols which are not encoded in the step (b);
    (d) generating a plurality of code streams, by arithmetically encoding as many binary symbols accumulated in the step (c) as the length, in bits, of a code stream corresponding to each segment until the encoded length of the code stream is a predetermined length, among the segments arithmetic encoded in the step (b); and
    (e) generating a code stream by multiplexing the plurality of code streams.

6. A bit-error resistant arithmetic decoding method for generating a data stream of binary symbols by decoding arithmetically encoded code streams, the arithmetic decoding method comprising the steps of:
    (a) determining the length of a code stream corresponding to a plurality of segments, and dividing input code streams into a plurality of segments;
    (b) arithmetically decoding the divided code stream as much as the length of a code stream corresponding to each segment for each segment;
    (c) accumulating codes which are not decoded in the step (b);
    (d) generating a data stream of a plurality of binary symbols, by arithmetically decoding code streams accumulated in the step (c), as much as the amount of the length of a code stream corresponding to each segment, for each segment which is not decoded as much as the length of a code stream corresponding to the segment, among the segments arithmetic decoded in the step (b); and (e) generating a data stream of binary symbols by multiplexing the plurality of binary symbols.

7. A computer readable recording medium having a bit-error resistant arithmetic encoding program for generating code streams by compressing input binary symbols, the arithmetic encoding program comprising:

a first arithmetic encoding module for arithmetically encoding symbols of each segment independently, having an initialization module for initializing state variables, which are required in the arithmetic encoding of each segment; a first symbol encoding module for arithmetic encoding symbols input in units of a segment using the state variables initialized by the initialization module in the unit of the segment, until the estimated length of a cumulative code stream which accumulates the estimated length of each symbol becomes equal to the length of a code stream corresponding to the segment, or until binary symbols allotted to a segment are all encoded; and a state variable storage module for temporarily storing state variables from the first symbol encoding module which ends arithmetic encoding in the unit of segment; and a second arithmetic encoding module for sequentially arithmetic encoding each segment, having a state variable restoration module for restoring state variables stored in the state variable storage module; a second symbol encoding module for encoding binary symbols that are not encoded in the first arithmetic encoding module until the estimated length of a cumulative code stream restored by the state variable restoration module becomes equal to the length of a code stream corresponding to the segment; and an arithmetic encoding finishing module for generating a code stream of the corresponding segment by determining the number of bits to be additionally output.

8. The computer readable recording medium having an arithmetic encoding program of claim 7, wherein when the type of encoding is defined as a mode; the lower limit of code location in the total probability sector is defined as L; the range of code location is defined as R; the number of bits to be additionally output is defined as BitstoFollow; a location which is at ½ point in the total probability sector is defined as Half; a location which is at ¼ point in the total probability sector is defined as Q1; a location which is at ¾ point in the total probability sector is defined as Q3; and the estimated length of a cumulative code stream is defined as cum_est_len, the initialization module initializes state variables as:

mode=NORMAL

L=0

R=HALF*2

BitstoFollow=0

Half=HALF

Q1=HALF/2

Q3=Q1+HALF cum_est_len=1, wherein Half means a location which is at ½ point in the total probability sector, and the value of Half is defined as 1<<(RES-1) when the resolution of probability is defined as RES.

9. The computer readable recording medium having an arithmetic encoding program of claim 8, wherein each of the first symbol encoding module and the second symbol encoding module comprising:

a probability value adjusting module for restricting the probability value of each symbol to be greater than or equal to the minimum value so that the estimated length of the cumulative code stream is not greater than the length of a code stream corresponding to a segment;

a code range narrowing module for narrowing the range of code location by as much as the probability value of a symbol;

a code range scale-up module for repeating scaling up the high half of the range of a code when the lower limit of code location (L) is greater than or equal to Half, scaling up the lower half of the range of code when the upper limit of code location (L+R) is less than Half, and scaling up the mid-half of the range of code when the lower limit of code location is greater than or equal to Q1 and the upper limit of code location is less than Q3; and an encoding mode changing module for changing an encoding mode into a scale-up mode by increasing all the variables by two times to increase the resolution by 1 bit when an encoding mode is a normal mode and the range of code location (R) is less than Half, and changing an encoding mode into a normal mode by decreasing all the variables by half to decrease the resolution by 1 bit when an encoding mode is a scale-up mode and the range of code location (R) is greater than or equal to Half.

10. The computer readable recording medium having an arithmetic encoding program of claim 9, wherein if the difference value of the length of a code stream corresponding to the segment and the estimated length of a cumulative code stream is d_len, the minimum value of the probability adjusting module is determined as $\frac{1}{2}^{d\_len}$ when the difference value is less than the resolution of a probability value, and otherwise, is determined as 0.

11. A computer readable recording medium having a bit-error resistant arithmetic decoding program for generating data stream of binary symbols by decoding arthmetic encoded code streams, the arithmetic decoding program comprising:

a first arithmetic decoding module for arithmetic decoding codes of each segment independently, having an initialization module for initializing state variables which are required in arithmetic decoding of each segment; a binary-0 addition module for adding binary a predetermined number of "0"s to a code stream allotted to each segment; a first code decoding module for arithmetic decoding code streams input in the unit of segment using the state variables initialized by the initialization module in the unit of segment, until the estimated length of a cumulative code stream which accumulates the estimated length of each code becomes equal to the length of a code stream corresponding to the segment, or until codes allotted to a segment are all decoded; and a state variable storage module for temporarily storing state variables from the first code decoding module which ends arithmetic decoding in the unit of segment; and a second arithmetic decoding module for sequentially arithmetic decoding each segment, having a state variable restoration module for restoring state variables stored in the state variable storage module; and (b2) a second code decoding module for decoding binary codes which are not decoded in the first arithmetic decoding module until the estimated length of a cumulative code stream restored by the state variable restoration module becomes equal to the length of a code stream corresponding to the segment.

* * * * *